(12) United States Patent
Martinelli et al.

(10) Patent No.: US 7,688,633 B2
(45) Date of Patent: Mar. 30, 2010

(54) METHOD FOR PROGRAMMING A MEMORY DEVICE SUITABLE TO MINIMIZE FLOATING GATE COUPLING AND MEMORY DEVICE

(76) Inventors: Andrea Martinelli, Via Valcossera 2/A, 26027 Nembro (BG) (IT); Stefan Schippers, Loc. Maraschina, 4, I-37019 Peschiera del Garda (VR) (IT); Marco Onorato, Via P. T, Massironl, 20, I-20049 Concorezzo (MI) (IT)

( * ) Notice: Subject to any disclaimer, the term of this patent is extended or adjusted under 35 U.S.C. 154(b) by 252 days.

(21) Appl. No.: 11/732,486

(22) Filed: Apr. 2, 2007

(65) Prior Publication Data

US 2007/0247917 A1    Oct. 25, 2007

(30) Foreign Application Priority Data

Mar. 31, 2006    (EP) .................................. 06425223

(51) Int. Cl.
*G11C 16/04*    (2006.01)
(52) U.S. Cl. .............................. 365/185.19; 365/185.24; 365/185.03; 365/149
(58) Field of Classification Search ............ 365/185.19, 365/185.22, 185.03, 185.24, 149
See application file for complete search history.

(56) References Cited

U.S. PATENT DOCUMENTS

| | | | |
|---|---|---|---|
| 5,774,397 A | 6/1998 | Endoh et al. | |
| 5,903,495 A * | 5/1999 | Takeuchi et al. | ........ 365/185.03 |
| 6,195,287 B1 | 2/2001 | Hirano | |
| 6,219,276 B1 | 4/2001 | Parker | |
| 6,717,861 B2 * | 4/2004 | Jeong et al. | ............ 365/185.28 |
| 7,372,754 B2 * | 5/2008 | Hwang et al. | ................ 365/218 |
| 2003/0185056 A1 | 10/2003 | Yoshida et al. | |
| 2005/0047223 A1 | 3/2005 | Chen et al. | |
| 2005/0146931 A1 | 7/2005 | Cernea et al. | |

FOREIGN PATENT DOCUMENTS

EP    1 615 227 A    1/2006

OTHER PUBLICATIONS

European Search Report for EP 06 42 5223 dated Oct. 4, 2006.

* cited by examiner

*Primary Examiner*—David Lam
(74) *Attorney, Agent, or Firm*—Trop, Pruner & Hu, P.C.

(57) ABSTRACT

Embodiment of a method for programming a memory device of the type comprising a matrix of memory cells divided in buffers of cells capacitively uncoupled from each other, the method comprising:
first programming of said cells belonging to a buffer;
second programming of said cells belonging to said buffer;
said step of first programming occurs with a ramp gate voltage having first pitch and programs said cells of said buffer with higher threshold distribution and said step of second programming occurs with a ramp gate voltage having pitch lower than the pitch.

29 Claims, 6 Drawing Sheets

FIG. 5 First programming before

FIG. 6

FIG. 7 after

FIG. 8 Second programming before

FIG. 9

FIG. 10 after

METHOD FOR PROGRAMMING A MEMORY DEVICE SUITABLE TO MINIMIZE FLOATING GATE COUPLING AND MEMORY DEVICE

PRIORITY CLAIM

This application claims priority from European patent application No. 06425223.2, filed Mar. 31, 2006, which is incorporated herein by reference.

TECHNICAL FIELD

An embodiment of the present invention relates to a method for programming a memory device suitable to reduce or minimize floating gate couplings.

In particular, an embodiment of the invention relates to a method for programming a memory device of the type comprising a matrix of memory cells divided in buffers of cells, capacitively uncoupled from each other, the method comprising:

first programming of said memory cells belonging to a buffer;
second programming of said memory cells belonging to said buffer.

An embodiment of the invention also relates to a memory device suitable to implement the method proposed.

An embodiment of the invention particularly, but not exclusively, relates to a Flash memory device and the following description is made with reference to this field of application by way of illustration only.

BACKGROUND

As is well known, the continuous decrease of the dimensions of integrated devices in modern technologies implies several problems.

In particular, in the case of memory devices, the reduction of distances between the memory cells strengthens the electric interactions between the adjacent cells in the usual structures with cell matrixes.

Figure 1:
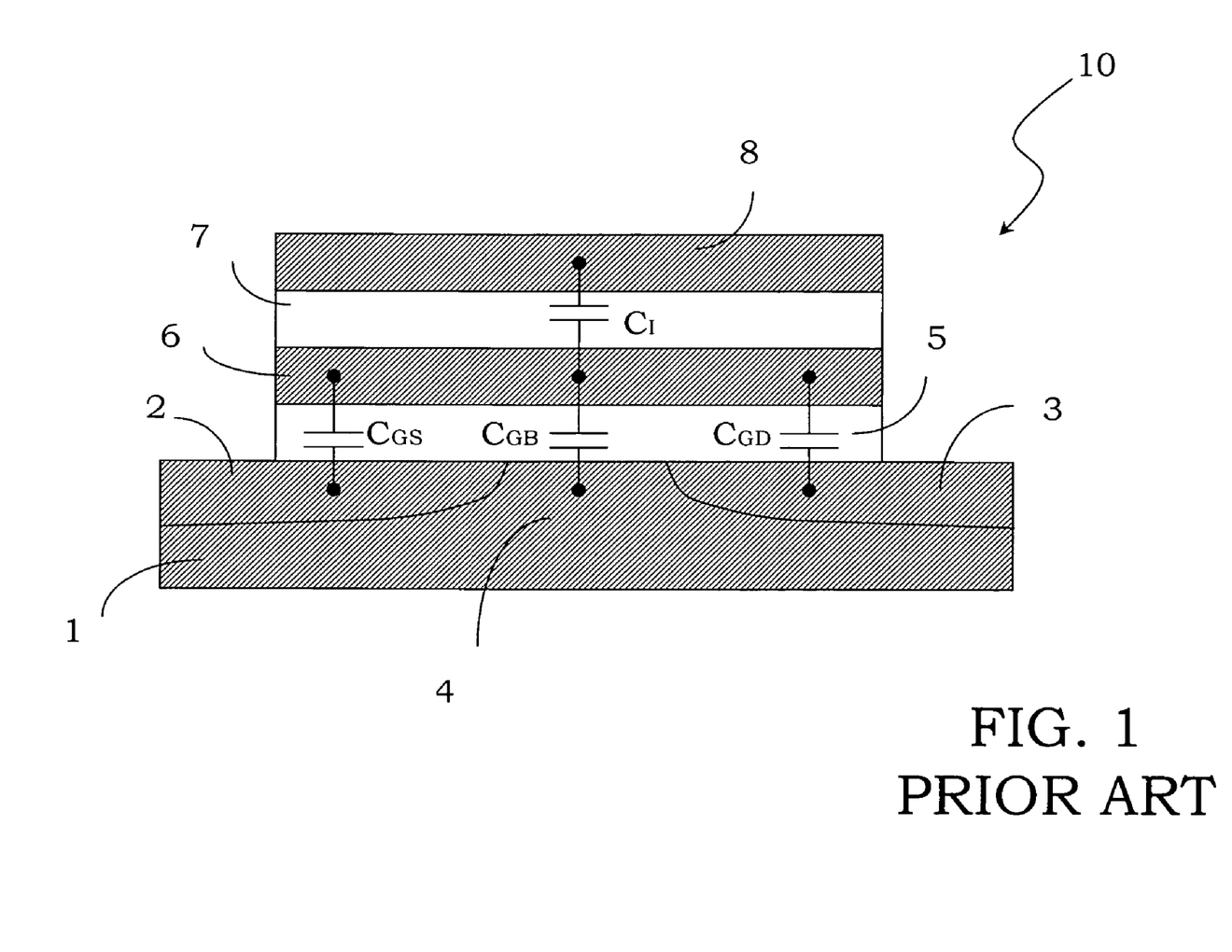
FIG. 1 schematically shows a cell of a memory matrix of the known type.

The majority of elements of a non-volatile memory device are floating gate memory cells, and FIG. 1 shows a cell being schematically and globally indicated with 10. The cells 10 are realized on a semiconductor substrate 1 wherein a source region 2 and a drain region 3 are defined, as well as a body region 4 interposed between the source 2 and drain 3 regions, the substrate 1 being overlapped by a first dielectric layer 5, so called gate dielectric, by a first polysilicon layer, defining the floating gate 6, by a second dielectric layer 7, so called interpoly dielectric, and by a second polysilicon layer, defining the control gate 8.

An integrated structure of cells 10 thus made has several capacitive couplings due to the alternation of conductive and insulating layers.

These couplings further interest the matrix of cells as a whole where, in particular, the capacitive coupling between the floating gates of topologically adjacent cells inside the matrix itself is relevant.

The mutual capacitive coupling between adjacent memory cells implies an alteration of the threshold voltage of a cell under examination when the threshold values of the adjacent cells vary.

This alteration is mainly felt during the programming step by the cells next to the cell to be programmed, and the alteration is proportional to the total threshold excursion of the cell to be programmed.

In particular, during the step of programming a memory matrix, the floating gates of the cells under programming are all at a low potential value.

A given cell being taken into consideration, it is noted that, due to the above described capacitive coupling and during the programming step, on its floating gate the potential value is at least partially transferred from the floating gates of the adjacent cells.

This potential variation of the floating gate shows itself as an enhancement of the threshold value of the cell under examination, also in case the charge of its floating gate, i.e., the value of the stored state in the cell, has not been varied on purpose.

It is thus to be noted that the threshold enhancement effect also interests cells having been correctly programmed, which are, however, adjacent to a cell being programmed.

For Flash memory devices of the multilevel type, the above indicated problems may worsen since, besides a low threshold level and a high threshold level, there are also intermediate threshold levels, and thus the intervals between one threshold and the other are reduced and shifts of the threshold values of the cells may occur, which may lead to errors in the reading of the programmed memory device.

To limit the alteration phenomena, maintaining the threshold levels programmed in each cell unaltered, it would be necessary to avoid that the cell, after having reached the desired threshold value, can see successive programming of the cells capacitively coupled thereto. This, however, typically requires modifications on the specifications of the programming step, which implies the cancellation, for example, of the repeated programming of a package of adjacent cells, an operation called, in the jargon, "bit manipulation".

Some methods are known for reducing these alteration phenomena and in particular the shifts of the threshold levels during the programming of a group of cells of the matrix.

Figure 2:
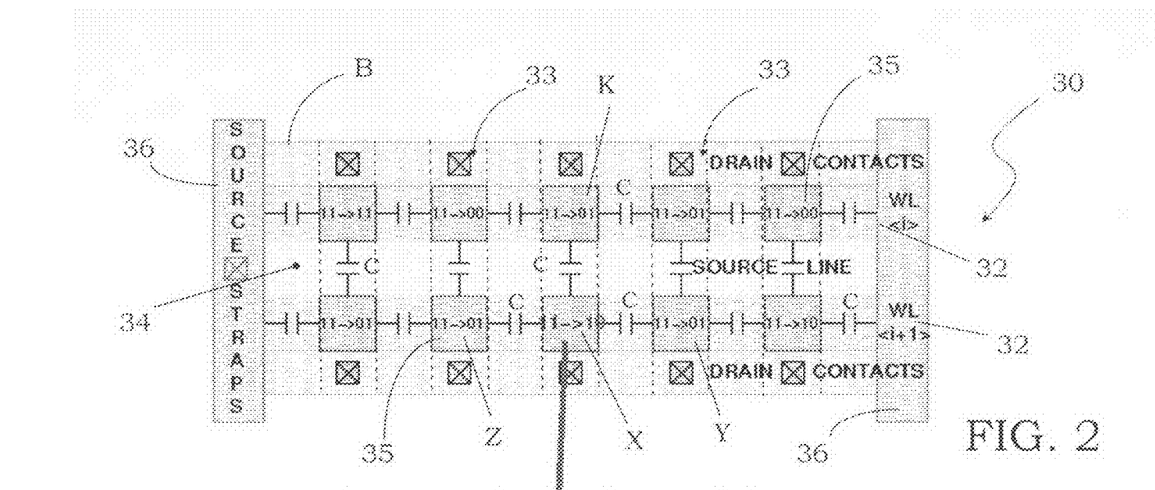
FIG. 2 schematically shows a buffer of a memory matrix with multilevel cells.

In particular, as shown in FIG. 2, in the programming of a matrix of cells 35, defined by a plurality of word lines WL 32 intersected by a plurality of bit lines BL 33, the cells 35 subject to the effect of the floating gate capacitive coupling are those contained between two consecutive word lines WL 32, which share a same source diffusion 34, and contained in the bit lines BL 33 comprised between two consecutive metallization strips 36.

This package of cells is also called a buffer, and is globally indicated with B. The buffer B, according to the specifications, most often coincides with the minimum amount of data being simultaneously programmable by a user and non subjected to a "bit manipulation".

In particular, FIG. 2 shows a multilevel matrix, in a specific way with 2 bits per cell, with a cell X, which must be programmed with the lowest distribution i.e., "10" and having three adjacent cells Y, Z, K which must be programmed at the highest distribution "01".

A programming method of the known type provides to use, for each buffer B of the matrix, a first programming which occurs, by means of a pulse sequence programming and successive verifications. This pulse sequence is carried out stepwise with increases of the constant pulse width and an "accurate" pitch p1 suitable to allow a correct positioning of the cells with intermediate distribution, i.e. "10" and "00".

This method provides, further to each programming pulse, an elementary verify operation of the values stored in each cell. This operation comprises a comparison between a first value detected by each cell of the buffer B by means of a sense amplifier, and a second value stored in a location of a RAM wherein the target values of the cells 35 in the buffer B are stored.

If from this comparison, the value detected overcomes or equals the value stored, i.e. the target value, the cell 35 is considered as positively verified and the target value is changed with a predetermined value, typically "11", which, afterwards, excludes the cell from successive pulse programming operations and relative verify operation.

The method then provides a second programming of the cells of the buffer B always by means of a pulse sequence programming and successive verifications. In particular, this pulse sequence is carried out step-wise with increases of the constant pulse width and a "rough" pitch p2, greater than the pitch p1 of the pulse sequence of the first programming.

This allows positioning the cells with higher distribution, i.e. "01", in a quick way.

The second programming is followed by second verify operations, however carried out with lower frequency, i.e. after a defined number of pulses.

The described method is, although efficient under several aspects, often too invasive: all the cells of the buffer B are subjected to the step of first programming. In fact, the first programming with "accurate" pitch p1 is carried out in an indiscriminate way on all the cells of the buffer B and the cells having been already correctly programmed are needlessly subjected to an enhancement of the threshold value. This implies an increase of the possible capacitive couplings on the floating gates of the cells being correctly positioned when the adjacent cells are programmed.

Further, through the second programming with "rough" pitch p2, the cells of the buffer B with higher threshold distribution are verified in a loose way and thus some cells may undergo an excessive enhancement of the threshold distribution and this may also imply capacitive couplings on the floating gates of the cells of the buffer B.

Finally, also the verify operation is particularly tricky, needing, for each buffer B, more elementary verify operations, which comprise the reading of the values stored in the cells of the buffer and the comparison with the corresponding values stored in the RAM, operations which prolong the programming times of the buffer B.

SUMMARY

An embodiment of the present invention is a method for programming a memory device having such characteristics as to allow a selective and accurate programming of multilevel memory cells overcoming limits and drawbacks still affecting or limiting methods and devices realized according to the prior art.

An embodiment of the present invention is programming, in a selective way, cells with higher threshold distribution and of programming, only successively and in a selective and accurate way, cells with intermediate distribution as well as of verifying the programmed cells of the buffer B without resorting to a comparison with the values stored in the RAM.

BRIEF DESCRIPTION OF THE DRAWINGS

Characteristics and advantages of a method and device according to one or more embodiments of the present invention will be apparent from the following description of an embodiment thereof given by way of indicative and non limiting example with reference to the annexed drawings.

DETAILED DESCRIPTION

With reference to these figures and in particular to the example of FIG. 2, 30 generally and schematically indicates a memory device whereto a method according to an embodiment of the invention is to be applied.

In the following description reference is made, by way of mere example, to a matrix of memory cells, with two bits per cell, and the same reference numbers as those previously indicated to identify details having the same structure and function will be maintained.

In a similar way, the method is also used in matrixes of multilevel memory cells with greater capacity (e.g., three or more bits per cell).

The method proposed is based on the consideration that a matrix of memory cells 35 is organized in a plurality of word lines WL 32 intersected by a plurality of bit lines BL 33.

Further, the memory matrix is considered as divided into a plurality of buffers B of cells 35. These latter, being adjacent to each other, can be affected by a capacitive coupling of floating gates.

Each buffer B is defined by the cells 35 of the device 30 belonging to two consecutive word lines WL 32, which share a same source diffusion 34, and belonging to the bit lines BL 33 comprised between two consecutive metallization strips 36. The buffers B are capacitively uncoupled from each other.

A value programmed in each cell 35 belonging to a buffer B could be affected and/or modified during a programming step of adjacent cells comprised in the buffer B due to the parasite capacitances, schematically indicated with C in FIG. 2, between the respective floating gates.

In particular, the cells 35 of the buffer B are programmed at a value called a target value which defines, for each cell 35, a final threshold distribution.

This realization example is only shown so as to simplify the description of the method proposed, similar considerations being applicable also to multilevel cells, i.e., with more than two bits per cell.

Figure 3:
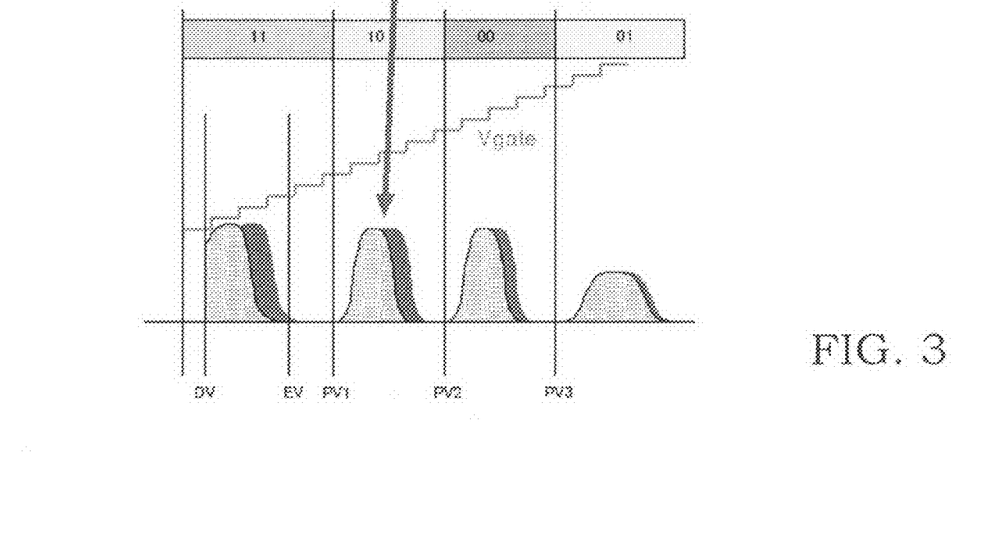
FIG. 3 schematically shows possible threshold distributions of multilevel cells of the known type.
Figure 4:
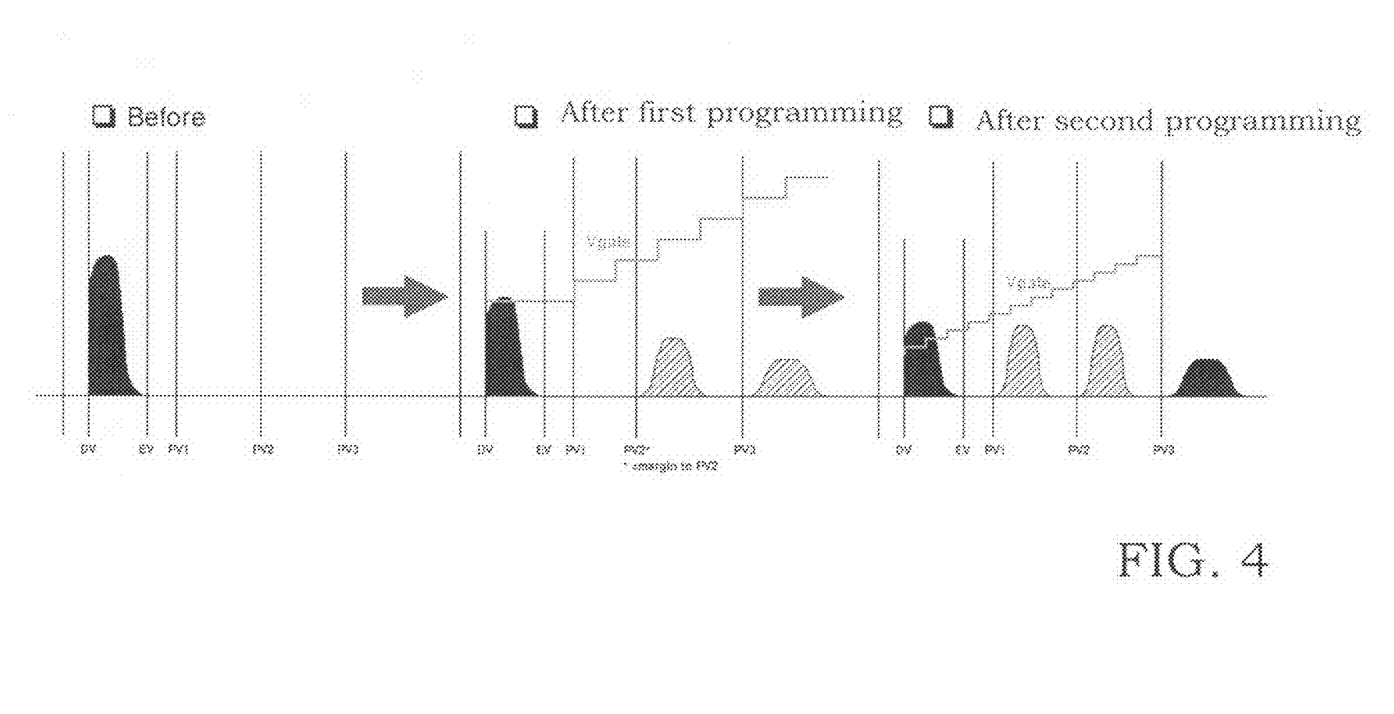
FIGS. 4 to 10 show, in sequence, different steps of a programming method realized according to an embodiment of the present invention.

On the basis of a standard nomenclature and by adopting a possible codification of the threshold distributions according to a Gray code, the cells 35 with a first target value "11" have a threshold distribution comprised between a so called Depletion Verify value DV and a so called Erase Verify value EV, the cells 35 with a second target value "10" have a threshold distribution comprised between a first PV1 and a second PV2 programming value, the cells 35 with a third target value "00" have a threshold distribution comprised between the second PV2 and a third PV3 programming value and the cells 35 with a fourth target value equal to "01" have a distribution higher than the third programming value PV3, as shown in FIG. 3.

A method for programming the memory device 30 according to an embodiment of the present invention provides, for each buffer B, a step of first programming preceded by a step of first classification, which allows assigning to each cell 35 of the buffer B a "first intermediate value" according to the final threshold distributions.

In particular, according to an embodiment of the present invention, during the first programming step the cells 35 with higher threshold distribution are programmed.

The "first intermediate value" has a first operative value "10" comprising a logic value which, according to the present embodiment, is the zero and a complementary logic value, i.e. a one, a second operative value "00" comprising a pair of logic values and a neutral value "11" comprising a pair of complementary logic values.

Figures 5, 6:
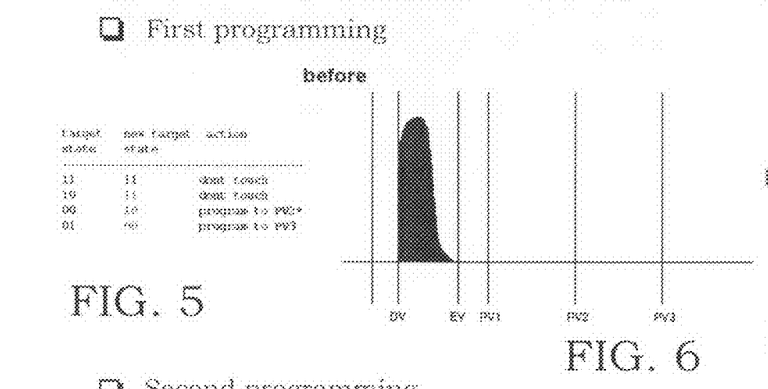

Thus, as highlighted in FIG. 5, the step of first classification attributed assigns the cells 35 with the first and the second target value, "11" and "10", the neutral value "11", disabling them from the successive programming being the cells 35 with lower threshold distribution.

The cells 35 with the third target value, "00", are assigned, by the step of first classification, the first operative value "10" and the cells 35 with fourth target value "01" are assigned the second operative value "00", enabling them for the successive programming.

The "first intermediate values" assigned to each cell 35 of the buffer B are suitably stored in a RAM memory normally associated with the matrix of cells 35.

The step of first programming of the buffer B occurs by means of the application, to the cells 35 enabled by the step of first classification, of a gate voltage as sequence of first ramp pulses with increases of the constant pulse width and a first "rough" pitch p1.

In other words, a cell 35 of the buffer B is subjected to the step of first programming if at least one of the two bits of the "first intermediate value", assigned to the cell 35 by the step of first classification and stored in the RAM memory, is equal to zero.

It is also to be noted that the enabled cells 35 are effectively the cells 35 which must undergo a greater jump of the threshold distribution, all the cells 35 starting in fact from the "virgin" distribution with lower value, i.e. the distribution "11", as schematically shown in FIG. 6.

Figure 7:
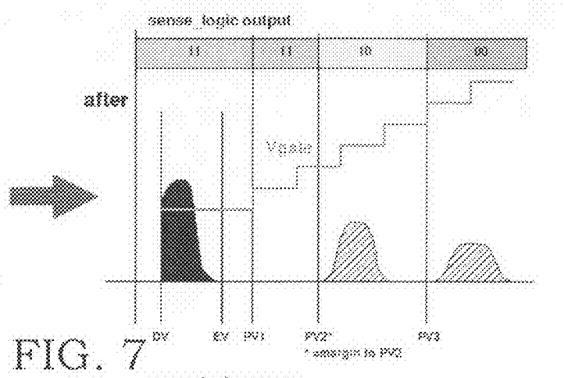

The cells 35 with first operative value "10" are programmed with a temporary threshold distribution comprised between a programming intermediate value PV2* and the third programming value PV3, and the cells 35 with second operative value "00" are programmed with a threshold distribution higher than the third programming value PV3, as highlighted in FIG. 7.

Suitably, the intermediate programming value PV2* is a value lower than the defined second programming value PV2, the threshold distributions of cells 35 with first operative value "10" being limited only afterwards to the real second programming value PV2, as it will be better The summarizing scheme of the step of first classification and of first programming the following:

| Target Value | 1° neutral/operative intermediate values | Action step of 1° programming |
|---|---|---|
| 11 | 11 | Do not program |
| 10 | 11 | Do not program |
| 00 | 10 | Programming to PV2* |
| 01 | 00 | Programming to PV3 |

In particular, it is noted that by means of the step of first classification the cells 35 to be programmed having higher threshold distribution have been selected, corresponding to the cells 35 with the third target value "00" and the fourth target value "01", and this allows the step of first programming to use a succession of first pulses of the gate voltage with a first "rough" p1.

Moreover, the cells 35 having the third target value "00" and fourth target "01", the cells with higher final threshold distribution are the cells 35 which mostly contribute to the floating gate capacitive coupling. Thus, thanks to a method according to an embodiment of the present invention, the possible coupling in this step occurs with "virgin" cells 35 having lower threshold distribution and having been given the neutral value "11".

As it will be clearer hereafter in the description, the threshold distribution corresponding to the first target value '11' is the only one being affected by the floating gate couplings in a significant measure. This effect is thus accurately evaluated and included in the margins to be taken before hand in defining the Depletion Verify DV and Erase Verify EV values and in particular their difference (DV−EV), as well as in defining the first programming value PV1 relative to the value '10' i.e., according to the Gray codification adopted, to the lowest programmed threshold distribution.

Moreover, the use of the first "rough" pitch p1 is possible since the programming step occurs on cells 35 with target value "01" and with higher threshold distribution, i.e., non critical, and on cells 35 with target value "00" and with threshold distribution comprised between the programming intermediate value PV2* and the third programming value PV3 where the programming intermediate value PV2* represents a compromise between the aggressiveness of the first programming ramp and the floating gate coupling of the cells 35 with intermediate distributions.

It is also to be noted that the lowering of the programming intermediate value PV2* with respect to the second programming value PV2 allows "aggressive" steps maintaining the distribution of the cells 35 with target value "00" within the distribution margins required and it will be accurately positioned during the successive programming step. A programming intermediate value PV2* being too near the PV2 value risks requiring steps being closer to the programming pulses and a greater floating gate capacitive effect during the step of first programming. On the other hand, a too low value may allow a first programming being more aggressive and thus quicker but may increase the effect of the coupling on the distributions being object of the second programming which, being the intermediate ones, are typically the most critical. In particular, the distribution '10' would suffer from the coupling of the distribution '00' left farther from the target value of the first programming.

An embodiment of the present invention, successively provides, at each pulse applied by the step of first programming, a step of first verify.

The step of first verify gives the threshold distributions programmed in the cells 35 of the buffer B and detected by means of a sense logic circuit corresponding first output values, which are defined by means, for example, of a Gray coding similar to what has been previously described.

The step of first verify provides a shift step of the first output values detected by the sense logic circuit to define "second intermediate values".

Suitably, the "second intermediate values" have, for the embodiment described, a coding similar to the one used to assign the "first intermediate values".

In particular, the cells 35 programmed with threshold distribution comprised between the intermediate value PV2* and the third operative value PV3 are given the first operative value "10" and the cells 35 with threshold distribution higher than the third operative value PV3 are given the second operative value "00", while the cells 35 with lower threshold distribution are given the neutral value "11".

In this way, the step of first verify with the sense logic circuit and the shift step compensate the step of first classification with the storage of the intermediate values in place of the target values in the RAM memory.

By means of the shift step, the "second intermediate values" have a bit equal to zero only if the cells 35 have been correctly programmed during the step of first programming reaching one of the two threshold distributions defining the first and the second operative value equal to "10" and "00" and respectively corresponding to the cells 35 with target values equal to "00" and The step of first verify provides a verify logic which, applied to said "second intermediate values", modifies the "first intermediate values" associated with the cells 35 and stored in the RAM memory.

Suitably, the verify logic modifies a bit of an operative value associated with a cell 35 if the corresponding "second intermediate value" has a similar bit identical to the predetermined logic value "0" and stores the complementary logic value "1" in the bit of the operative value stored in the RAM memory.

Thanks to this verify logic it is possible to verify, in a separate way, the two bits of each cell 35 of the matrix, in fact it is enough to verify the presence of a complementary logic value "1" in the corresponding bit, more or less significant, of the "first intermediate value" of the cell 35 stored in the RAM memory.

In other words the verify logic meets a law "if a logic value zero "0" is read in the "second intermediate value", a complementary logic value "1" is stored in the corresponding "first intermediate value" in the RAM memory".

In this way, when each cell 35 reaches the desired threshold distribution from the corresponding target value, the "first intermediate value" in the RAM memory is stored in a masked way at "11" and thus during the successive steps of first programming and first verify this cell 35 in the buffer B will be ignored.

In particular, the step of first programming is interrupted when all the "first intermediate values" stored in the RAM are "11", i.e. they have the most and the least significant bits equal to the complementary logic value one Thanks to the first classification step and to the step of first verify, it is possible to verify the threshold distributions of the programmed cells 35 by simply applying the verify logic without carrying out any operation of comparison with the "intermediate values" stored in the RAM memory.

Alternatively, the first and the "second intermediate values" can be given according to a different mode than the one indicated and, in this case, an adequate verify logic is used to carry out the verify step of the programmed values by means of a simple reading of the "second intermediate values", without resorting to comparison operations. A method for programming the device 30 according to an embodiment of the present invention provides, for each buffer B, once the programming of the cells 35 with higher threshold distribution has been completed, a step of second programming of the cells 35 of the buffer B with intermediate threshold distribution.

Suitably, the step of second programming is preceded by a step of second classification which gives the cells 35 a "third intermediate value" according to the final threshold distributions.

The "third intermediate value", according to the present embodiment, has the same values as those of the "first intermediate value", i.e.: a first operative value "10", a second operative value "00" and a neutral value "11".

Figures 8, 9:
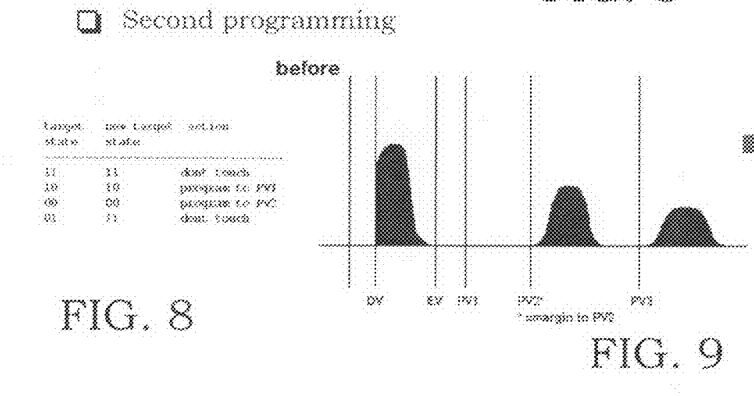

As highlighted in FIG. 8, the step of second classification gives the cells 35 with the first target value "11" the neutral value "11", the cells 35 with the second target value "10" the first operative value "10", the cells 35 with the third target value "00" the second operative value "00" and the cells 35 with the fourth target value "01" the neutral value "11".

The "third intermediate values" given to each cell 35 of the buffer B are suitably stored in the RAM memory used during the step of first programming.

Advantageously, the step of second programming occurs by applying to the cells 35 selected by the step of second classification a gate voltage as sequence of second ramp pulses with increases of the constant pulse width and a second "accurate" pitch p2.

Suitably, the second "accurate" pitch p2 of the second programming pulses is lower than the first rough pitch "p1" used during the step of first programming.

The second programming pulses exclusively interest the cells 35 of the buffer B with second and third target value "10" and "00" i.e., first and second operative value "10" and "00" while the cells 35 with first and fourth target value "11" and "01" are excluded from the step of second programming. Then, also in this case, one cell 35 of the buffer B is subjected to the step of second programming if at least one of the two bits of the "third intermediate value" given to the cell 35 by the step of second classification and stored in the RAM memory is equal to zero.

Figure 10:
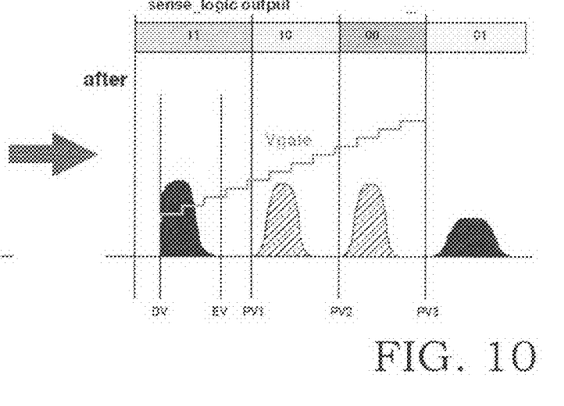

In particular, the cells 35 of the buffer B with first operative value "10" are programmed with a threshold distribution comprised between the first programming value PV1 and the second programming value PV2 while the cells 35 with the second operative value "00", which have a threshold distribution already pre-positioned during the step of first programming, are programmed by compacting the threshold distribution above the second programming value PV2 higher than the preceding intermediate programming value PV2*, as highlighted in FIGS. 9 and 10.

The step of second classification and the step of second programming are schematically summarized by the following table:

| Target Value | 3° neutral-operative intermediate values | Action step of 2° programming |
|---|---|---|
| 11 | 11 | Do not program |
| 10 | 10 | Program to PV1 |
| 00 | 00 | Program to PV2 |
| 01 | 11 | Do not program |

In particular, the step of second programming programs the cells 35 with intermediate threshold distributions, selected by the step of second classification and suitably programs them with second pulses of the gate voltage with second "accurate" pitch p2 allowing a greater precision and accuracy in the programming also with respect to the step of first programming which is carried out with "rough" pitch p1.

The cells 35 selected by the step of second classification show a reduced interval between the threshold distributions and thus a possible capacitive coupling between the floating gates of these cells 35 during the step of second programming is remarkably limited.

The second programming step successively provides, at each pulse applied by the step of second programming, a step of second verify.

The second verify step gives the threshold distributions programmed in the cells 35 of the buffer B and detected by using a sense logic circuit corresponding second output values.

The sense logic circuit is equal to the one used during the step of first verify and uses a coding of the threshold distributions according to the gray code for the identification of the second output values.

In particular, the step of second verify does not carry out any shift step. The step of second verify provides a verify logic which, applied to said second output values, modifies the "third intermediate values" associated with the cells 35 and stored in the RAM memory.

Suitably, the verify logic, similarly to the logic during the step of first verify, modifies a bit of the "third intermediate value" associated with a cell 35 if the corresponding output "second value" has a similar bit with logic value "0" and stores the complementary logic value "1" in the corresponding bit of the operative value.

Also in this case then, the verify logic meets the law "if a logic value zero "0" is read in the second output value, a complementary logic value "1" is stored in the corresponding "third intermediate value" stored in the RAM memory".

It is to be noted that, also during the step of second verify, it is possible to use a suitable shift step which modifies the second output values in relation with a specific coding used to identify the second output values.

When each cell 35 reaches the threshold distribution desired by the corresponding target value, the associated "intermediate value" is stored in a masked way at "11" and then during the successive steps of second programming and second verify this cell 35 in the buffer B will be ignored.

In particular, the step of second programming is interrupted when all the "third intermediate values" stored in the RAM are "11", i.e., they have a first and a second bit equal to the complementary logic value one 1.

It is also to be noted that, during the step of second programming, the two intermediate distributions suffer from very contained couplings since the threshold excursions involved are limited to the difference between the second programming value PV2 and the intermediate value PV2* and to the difference between the Depletion Verify value DV and first programming value PV1 which represent the maximum jump possible in this step.

A method according to an embodiment of the present invention thus has several advantages, in particular the step of second programming having second pitch p2 more accurate than the first pitch p1 of the step of first programming allows a greater precision and accuracy in the programming of each cell 35 limiting or avoiding the arise of dangerous capacitive interferences between the floating gates of the adjacent cells 35.

An embodiment of the present invention also relates to a memory device 190 suitable to minimize the floating gate couplings.

Figure 11:
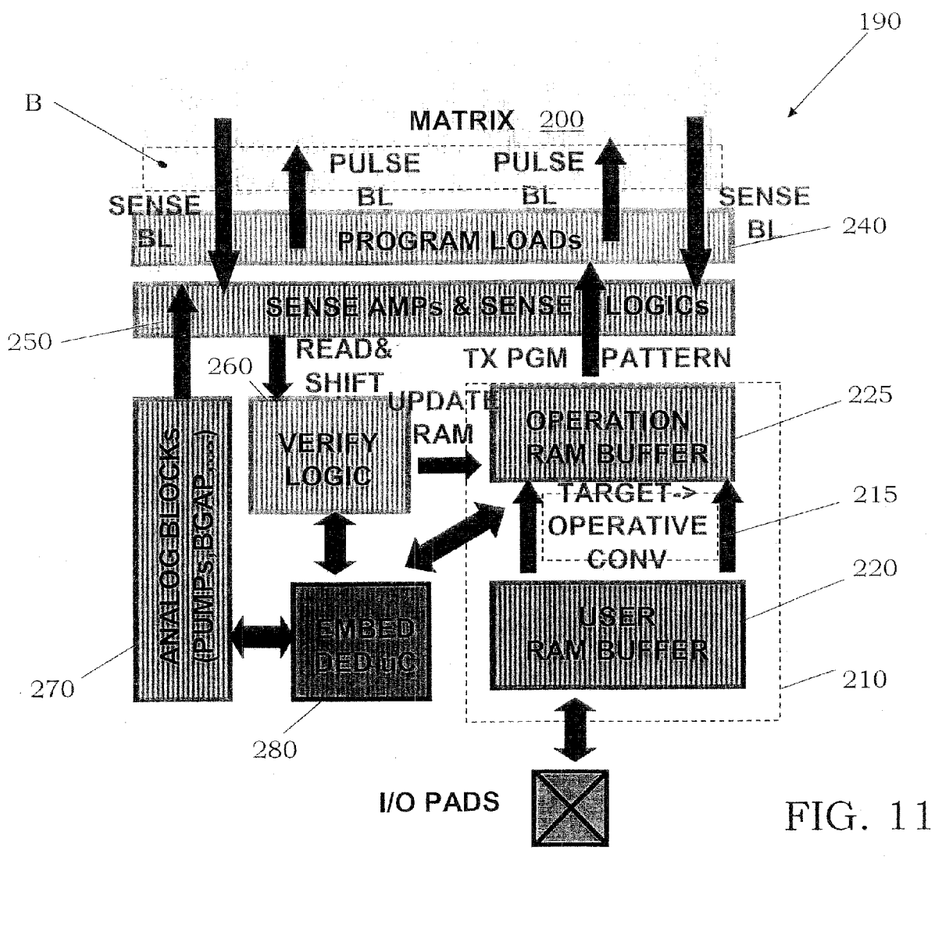
FIG. 11 shows, in a schematic way, a memory device according to an embodiment of the present invention.

A device 190 according to an embodiment of the present invention, schematically shown in FIG. 11, is of the type comprising at least one matrix 200 of memory cells structured in rows WL and columns BL of cells, which, in the present embodiment, are of the Flash-Nor type.

The matrix 200 is divided into buffers B of cells capacitively uncoupled from each other.

The device 190 comprises a first block 210 with at least one target memory 220 comprising the target values to be stored in the cells of the buffer B.

The first block 210 of the device 190 comprises at least one RAM memory 225, interposed between the target memory 220 and the second programming block 240.

Suitably, moreover, the first block 210 comprises coding circuits 215 suitable to associate, with said target values stored in the target memory 220, suitable intermediate values which are stored in the RAM memory 225 according to a suitable classification.

The RAM memory 225 of the first block 210 is connected to a second programming block 240 for the cells 35 of the buffer B able to generate and apply to the cells 35 a gate voltage as a sequence of ramp pulses with increases of the width of the constant pulse and a definite pitch.

The second block 240 thus comprises circuits such as for example High Voltage circuitries.

The device 190 further comprises a third detection block 250 comprising a plurality of read amplifiers Sense Amps which detect the threshold distributions programmed in the cells 35 of the buffer B and give corresponding output values.

The third detection block 250 comprises shift circuits Sense_logics suitable to associate, with output values detected in the cells 35 by the read amplifiers Sense_amps, defined output intermediate values.

The device 190 also comprises a fourth verify block 260 interposed between the third block 250 and the RAM matrix 225 of the first block 210 which comprises at least one verify circuit.

The verify circuits of the fourth block 260 comprise only logic circuits.

Suitably, these logic circuits meet a verify logic according to a law "if a logic value zero "0" is read in the output intermediate value a complementary logic value "1" is read in the corresponding intermediate value stored in RAM memory 225. Moreover, the fourth block 260 comprises circuits such as for example those known with the name "masked write" which allow to maintain unaltered the value stored in the RAM memory in case the read value is equal to the logic value '1'.

The device 190 further comprises a fifth analog block 270 which has a plurality of supply circuits Pumps, BGAP suitable to supply the High Voltage circuits of the second block 240 with suitable supply voltages.

The device 190 then comprises a sixth timing block 280 suitable to supply the first block 210, the fourth verify block 260 and the fifth block 270 with suitable timing signals for suitably timing, according to definite procedures, the operations of the various blocks.

The operation of the device 190 provides storage, in the target memory 220, for the target values to be stored in the cells 35 of the buffer B.

This operation is described for an embodiment with cells 35 of the buffer B which contain two bits per cell.

On the basis of a standard nomenclature and by adopting a possible coding of the threshold distributions according to the Gray code, the cells 35 with a first target value "11" have a threshold distribution comprised between a so called Depletion Verify DV value and a so called Erase Verify EV value, the cells 35 with a second target value "10" have a threshold distribution comprised between a first PV1 and a second programming value PV2, the cells 35 with a third target value "00" have a threshold distribution comprised between the second value PV2 and a third programming value PV3, and the cells 35 with a fourth target value equal to "01" have a higher distribution than the third programming value PV3, as shown in FIG. 3.

The coding circuits 215 associate these target values with suitable first intermediate values according to a coding that allows to make operative, i.e. programmable, only the cells with target value associated with a high threshold distribution, which, according to the embodiment shown, corresponds to the target values "00" and "01". The cells with target value "11" and "10" are given a neutral value "11", this coding allows to exclude the corresponding cells 35 of the buffer B from the programming.

These "first intermediate values" are suitably stored in the RAM memory 225.

The High Voltage circuits of the second block 240 generate and apply to the cells 35 of the buffer B with first operative intermediate values a gate voltage as sequence of ramp pulses with rough pitch "p1".

In particular, the second block 240 programs the cells 35 of the buffer B having target value "00" with a temporary threshold distribution comprised between a programming intermediate value PV2\* and the third programming value PV3 and the cells having target value "01" with a threshold distribution higher than PV3.

Suitably, the intermediate programming value PV2\* is a lower value than the one defined according to the programming value PV2.

After the programming of the cells 35 of the buffer B, the read amplifiers Sense Amps of the third block 250 detect the threshold distributions of the programmed cells 35, giving respective first output values.

The shift circuits Sense_logics of the third block 250 give, to the first detected output values, output "second intermediate values" which, according to the present embodiment, show a coding similar to the one of the "first intermediate values".

The verify circuits of the fourth block 260 apply the verify logic and, when a logic value "0" is present in a bit of the output "second intermediate value", modify the respective bit in the "first intermediate values" stored in the RAM memory 225.

When all the values in the RAM memory 225 are equal to "1" then the cells 35 with higher threshold distribution are programmed and the cells 35 with intermediate threshold distribution will be programmed.

For the programming of the cells 35 with intermediate threshold distribution, the coding circuits 215 associate these target values stored in the target memory 220 with suitable "third intermediate values" according to a coding which allows to make operative, i.e. programmable, only the cells with target value equal to "10" and "00".

In this way, the cells with target value "10" and "00" are respectively given a first operative value "10" and a second operative value "00" while the cells with target value "11" and "01" are given the neutral value "11".

In particular, the cells 35 with the second operative value "00", which have a threshold distribution already pre-positioned during the previous programming, are programmed by compacting the threshold distribution above the second programming value PV2 higher than the preceding intermediate programming value PV2\*, as highlighted in FIGS. 9 and 10.

The "third intermediate values" given by the coding circuits 215 are stored in the RAM memory 225 of the first block.

Advantageously, according to the operative "third intermediate values" the High Voltage circuits of the second block 240 generate and apply to the cells 35 of the buffer B a gate voltage as sequence of ramp pulses with accurate pitch "p2".

Suitably, the accurate pitch "p2" is lower than the pitch "p1" used during the previous programming.

In particular, the second block 240 programs the cells 35 of the buffer B having target value "10" with a temporary threshold distribution comprised between the first programming value PV1 and the second programming value PV2 and compacts the cells having target value "00" with a threshold distribution comprised between the programming value PV2 and the third programming value PV3.

After the programming of the cells 35 of the buffer B, the read amplifiers Sense Amps of the third block 250 detect the threshold distributions of the programmed cells 35, giving respective second output values.

The shift circuits Sense_logics of the third block 250 according to the present embodiment for the coding adopted are not used, or, better, the output intermediate values correspond, during the programming of the intermediate values, to the second output values.

The verify circuits of the fourth block 260 apply the verify logic and when a logic value "0" is in a bit of the second output value they modify the respective bit in the "third intermediate values" stored in the RAM memory 225.

When all the values in the RAM memory 225 are equal to "1" then the cells 35 with intermediate threshold distribution are programmed and thus all the cells 35 of the buffer B have threshold distributions according to the respective target values stored in the target memory 220.

An advantage of a device according to an embodiment of the present invention is that of associating each target value with suitable intermediate values according to definite programming logics which allow to classify and select the cells to be programmed.

A further advantage is that of showing a verify logic exclusively comprising quick and precise logic circuits without the presence of comparison circuits.

An advantage of an embodiment of the described method is that of reducing the interference phenomena due to the parasite capacities between the floating gates of adjacent cells. In fact, a method according to an embodiment of the present invention programs, at each programming step, cells belonging to consecutive threshold distributions, eliminating the interaction between the cells which must reach high threshold distributions and the cells must reach lower threshold distributions which could receive greater interferences or charge transfers.

A further advantage is that the cells of the buffer, by means of the step of first and second classification, are previously selected for the programming and this allows, besides avoiding useless threshold sudden changes, to speed up the programming of the buffer itself.

A further advantage is that of showing a verify step successive to each programming step which is simply based on a verify logic, avoiding any operation of comparison especially with the target values stored, thus making the method quicker and more efficient.

Another advantage is due to the fact that a method according to an embodiment of the present invention allows remarkably speeding up the verification of the cells stored reducing the execution times, the verify step comprises a sense logic circuit which shows an extreme simplicity allowing in the meantime an increase of the performances.

A further advantage is the possibility of programming and verifying, separately and in an independent way, the least significant bit and the most significant bit of each cell 35 of the buffer B masking the bit of the operative value associated with the cell not interested in the operation, i.e. storing the logic value complementary in this bit.

Another advantage is linked to the typicality of the RAM memory associated with the buffer B which is generally synchronous, thus, with respect to the known methods which, with a same synchronous memory, require two clock cycles, one for the reading of the value previously stored in the RAM memory and one for the writing of the new value to be stored, an embodiment of the method described allows use of a single clock cycle for the writing—masked, i.e. without modifying other logic values belonging to the same word—of the logic value complementary in the RAM memory.

Another advantage of the method according to an embodiment of the present invention is the possibility of ignoring possible cells 35 of the buffer B having been detected as faulty, in fact, by storing in the RAM memory the faulty cell 35 with the neutral value, for example "11", the cell is ignored during the successive steps of first and second programming and respective verify steps.

An embodiment of the present invention may also be generalized in case of memories with more than two bits per cell.

Figure 12:
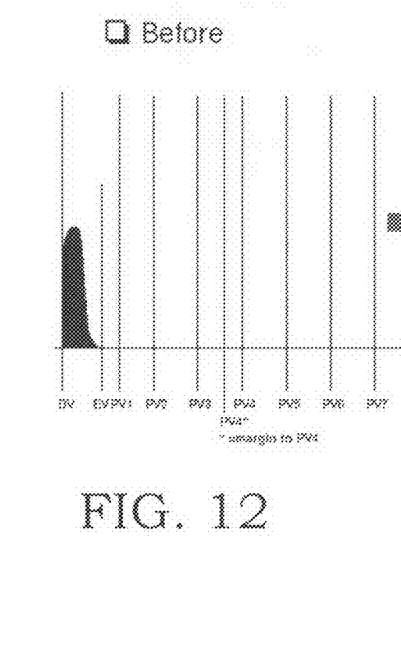
FIGS. 12 to 14 show, in sequence, different steps of a programming method realized according to another embodiment of the present invention.
Figure 13:
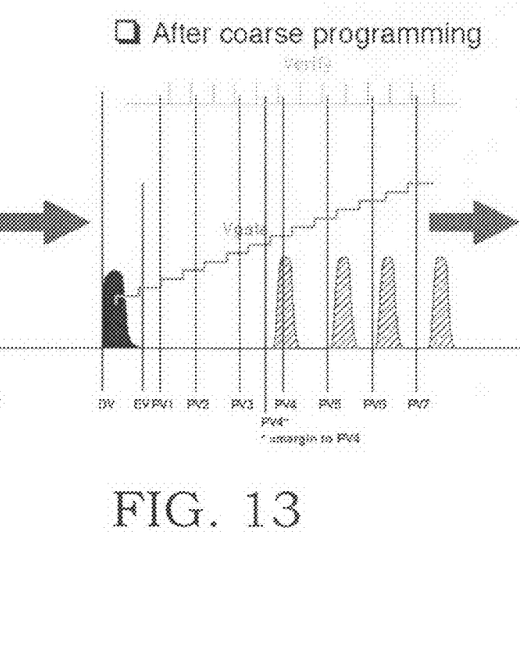
Figure 14:
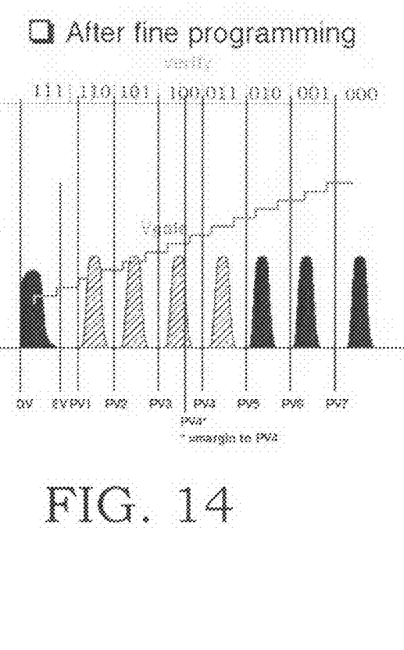

For example, in FIGS. 12, 13 and 14 are shown different steps of a further embodiment of the method for programming, as applied to a memory cells matrix that comprises multilevel cells, more particularly three-bit cells.

In particular, according to a possible codification, each cell should be programmed at a first value, called target value, which defines, for each cell, a final threshold distribution.

The method provides a step of first programming preceded by a step of first classification, which allows assigning to each cell a "first intermediate value" according to the final threshold distributions.

According to an embodiment of the present invention, during the first programming step the cells with higher threshold distribution are programmed.

Moreover, the embodiment provides a step of second programming preceded by a step of second classification, in order to enable the programming the cells with lower threshold distribution and to disable cells which are already correctly positioned in a respective threshold distribution corresponding to the target value.

Such steps of first and second programmings occur with a gate voltage being a sequence of a first and a second ramp pulse with corresponding first and second pitches to program enabled cells. In this case a first pitch p1 equal to or lower than the second pitch p2 can be used.

As shown in the FIG. 14, the cells with a first target value "111" have a threshold distribution comprised between a so called Depletion Verify value DV and a so called Erase Verify value EV, the cells with a second target value "110" have a threshold distribution comprised between a first PV1 and a second PV2 programming value, the cells with a third target value "101" have a threshold distribution comprised between the second PV2 and a third PV3 programming value, the cells with a fourth target value equal to "100" have a threshold distribution comprised between the third PV3 and a fourth PV4 programming value, the cells with a fifth target value equal to "011" have a threshold distribution comprised between the fourth PV4 and a fifth PV5 programming value, the cells with a sixth target value "010" have a threshold distribution comprised between the fifth PV5 and a sixth PV6 programming value, the cells with a seventh target value "001" have a threshold distribution comprised between the sixth PV6 and a seventh PV7 programming value and an eighth target value "000" have a threshold distribution higher than the seventh programming value PV7.

According to an embodiment of the present invention, the step of first classification enables the cells with higher threshold distribution assigning them a first operative value and disables the cells with lower threshold distribution assigning them a neutral value.

According to a second embodiment of the proposed method, the summarizing scheme of the step of first classification and of first programming is the following:

| Target Value | 1° neutral/operative intermediate values | Action step of 1° programming |
| --- | --- | --- |
| 111 | 1111 | Do not program |
| 110 | 1111 | Do not program |
| 101 | 1111 | Do not program |
| 100 | 1111 | Do not program |
| 011 | 1110 | Programming to PV4* |
| 010 | 1100 | Programming to PV5 |
| 001 | 1000 | Programming to PV6 |
| 000 | 0000 | Programming to PV7 |

Being:
target value: value at which the cells should be programmed;
1° operative/neutral intermediate values: value given to a cell during the step of first classification, the cells with neutral value being disabled during the step of first programming;
Action step of 1° programming: action to which the cells are to be subjected during the step of first programming.

According to the above indicated scheme, the intermediate values are values with four bits and in particular the operative values comprise at least one bit with a predetermined logic value "0" and the neutral value comprises all the bits with a complementary logic value "1".

The method provides for storing the first intermediate values in a RAM memory associated with said matrix of cells.

The step of first programming provides for programming the cells having higher threshold distribution with at least one temporary threshold distribution. For example, the cells with operative value "1110" during the step of first programming are programmed with a threshold distribution comprises from an intermediate value of programming PV4* and the fifth intermediate value PV5 or a corresponding read value.

Advantageously, the intermediate programming value PV4* is a value lower than the real fourth programming value PV4, such cells being limited only afterwards to the real fourth programming value PV4 during the step of second programming.

The summarizing scheme of the step of second classification and of second programming is the following

| Target Value | 3° neutral/operative intermediate values | Action step of 2° programming |
| --- | --- | --- |
| 111 | 1111 | Do not program |
| 110 | 1110 | Programming to PV1 |
| 101 | 1100 | Programming to PV2 |
| 100 | 1000 | Programming to PV3 |
| 011 | 0000 | Programming to PV4 |
| 010 | 1111 | Do not program |
| 001 | 1111 | Do not program |
| 000 | 1111 | Do not program |

The method provides for storing the neutral and operative intermediate values in the RAM memory associated with the matrix of cells.

Moreover, the method provides, after each step of first programming and second programming, a step of first verify and a step of second verify. Each step of first and second verify defines, by means of at least one sense logic circuit which tests the programmed cells, respective first and second output values.

The step of first verify and second verify provides a verify logic which, applied to the intermediate values, provides corresponding first and second output values and modifies the operative values associated with the cells and stored in the RAM memory.

In particular, if the corresponding output value has a bit identical to the predetermined logic value "0" and stores the complementary logic value "1" in the bit of the operative value stored in the RAM memory.

In this way, the steps of first programming and second programming are ended when all the bits of said operative values stored in the RAM memory are equal to the complementary logic value 1.

It is also to be noted that a different logic can be used by the steps of first classification and second classification to assign the intermediate values. In any case, the logic depends on the number of the threshold distribution that need to be differentiated simultaneously.

For example, using a logic that assign intermediate values for three bit cells, a step of preliminary programming that provides for programming the cells with a higher threshold distribution, in this case the cells with a target value "000", is needed. Suitably, the cells programmed by the preliminary programming are those mostly contributing to a higher floating gate capacitive coupling; moreover, these cells, having a higher threshold distribution or looser margins, can be programmed with a less accuracy.

Subsequently, a step of first classification assigns corresponding intermediate operative values to the cells with target value "011", "010" and "001" to enable that cells for the step of first programming; a subsequently step of second classification assigns corresponding intermediate operative values to the others cells that correspond to the target values "110", "101" and "100" enabling such cells for the step of second programming and assigns neutral values to the cells already correctly positioned by the step of first programming.

In this solution, advantageously, the size of the memory RAM wherein the intermediate values are memorized can be reduced; the reduction being equal to 25% of the four bits solution.

Likewise, considering for example a matrix of memory cells and using k bits for storing the threshold distribution of the programmed cell it is possible to find one or more codings for the operative values to be used in a similar management of a classification step and of a respective verify step.

In this case, the classification step uses k bits to store the information corresponding to the target value to be programmed in the single cell 35. It is possible to find one or more codings so as to allow, operating at the most with k distributions in each storage step, a similar management of the classification step and of the relative verify step.

The memory 190 of FIG. 11 may be incorporated in a system, such as a computer system, which includes another integrated circuit (IC), such as a controller, coupled to the memory.

From the foregoing it will be appreciated that, although specific embodiments of the invention have been described herein for purposes of illustration, various modifications may be made without deviating from the spirit and scope of the invention.

What is claimed is:

1. A method comprising:

first programming a plurality of cells using gate voltage ramp pulses of a first step width to program said cells with a higher threshold distribution;

second programming of said cells using gate voltage ramp pulses with a second step width equal to or lower than said first step width; and before said first programming step, enabling the cells with higher threshold distribution for said first programming and disabling cells with lower threshold distribution and before said second programming, enabling the cells with intermediate threshold distribution and disabling cells already correctly positioned in a respective distribution corresponding to a target value.

2. Method according to claim 1 wherein enabling includes providing operative values to said cells and disabling includes providing a neutral value to said cells.

3. Method according to claim 2 wherein said operative values comprise at least one bit with a predetermined logic value and said neutral value comprises all the bits with a complementary logic value.

4. Method according to claim 2 wherein said intermediate values are stored in a RAM memory associated with said matrix of cells.

5. Method according to claim 1 further comprising, after said first and second programming, verifying by defining, by means of at least one sense logic circuit which tests said programmed cells, respective first and second output values.

6. Method according to claim 5 wherein verifying includes modifying said operative values stored in said RAM memory by means of a verify logic applied to said first and second output values.

7. Method according to claim 5 wherein said first and second output values are the corresponding target values of said tested threshold distributions.

8. Method according to claim 5 including modifying a bit of said operative value if said first or second output value has a corresponding bit equal to said predetermined logic value storing said complementary logic value in said bit of said operative value.

9. Method according to claim 8 including ending said first and second programming when all the bits of said operative values are equal to said complementary logic value.

10. Method according to claim 5 wherein verifying includes a shift step of said first output values, said shift step giving output "second intermediate values" corresponding to said operative values for said cells programmed with higher threshold distributions and corresponding to said neutral value for said cells programmed with lower threshold distribution.

11. Method according to claim 1 including first programming to program said cells having higher threshold distribution with at least one temporary threshold distribution and said second programming step includes programming said cells having intermediate threshold distribution with respective threshold distributions of target values.

12. Method according to claim 1 applied to a matrix with said cells of the multilevel type having threshold values respectively delimiting the threshold distributions of target values of said cells wherein said step of first classification and said step of first programming of said matrix of said multilevel cells follows the present scheme:

| Target Value | 1° operative/neutral intermediate values | Action step of 1° programming |
| --- | --- | --- |
| 11 | 11 | Do not program |
| 10 | 11 | Do not program |
| 00 | 10 | Program to PV2* |
| 01 | 00 | Program to PV3 |

Being:
target value: value at which the cells are to be programmed;
1° operative/neutral intermediate values: value given to a cell during the step of first classification, said cells with neutral value being disabled during the step of first programming;
Action step of 1° programming: action to which corresponding cells are to be subjected during said step of first programming.

13. Method according to claim 12 wherein said step of second classification and said step of second programming of said cells follows the present scheme:

| Target value | 3° operative/neutral intermediate values | Action step of 2° programming |
| --- | --- | --- |
| 11 | 11 | Do not program |
| 10 | 10 | Program to PV1 |
| 00 | 00 | Program to PV2 |
| 01 | 11 | Do not program | being:
target value: value at which the cells are to be programmed;
3° operative/neutral intermediate values: value given to a cell during the step of second classification, said cells with neutral value being disabled during the step of second programming;
Action step of 2° programming: action at which corresponding cells are to be subjected during the step of second programming.

14. Method according to claim 12 wherein said shift step gives said first output values respective "second intermediate values", said second output values comprising said first operative value, associated with a cell with threshold distribution comprised between said "second intermediate value" and said third operative value, said second operative value associated with said cells with higher threshold distribution than said third operative value, and said neutral value associated with the cells which have not reached said distributions.

15. Method according to claim 14 wherein said verify logic stores said complementary logic value in a bit of said operative value, stored in said RAM memory, if said output "second intermediate value" or said second output value has an similar bit equal to said predetermined logic value.

16. Method according to claim 1 applied to a matrix with said cells of the multilevel type having threshold values respectively delimiting the threshold distributions of target values of said cells wherein first programming includes:

| Target Value | 1° neutral/operative intermediate values | Action step of 1° programming |
| --- | --- | --- |
| 111 | 1111 | Do not program |
| 110 | 1111 | Do not program |
| 101 | 1111 | Do not program |
| 100 | 1111 | Do not program |
| 011 | 1110 | Programming to PV4* |
| 010 | 1100 | Programming to PV5 |
| 001 | 1000 | Programming to PV6 |
| 000 | 0000 | Programming to PV7 |

Being:
target value: value at which the cells are to be programmed;
1° operative/neutral intermediate values: value given to a cell during the step of first classification, said cells with neutral value being disabled during the step of first programming;
Action step of 1° programming: action to which said cells are to be subjected during said step of first programming.

17. Method according to claim 16 wherein said second programming includes:

| Target Value | 3° neutral/operative intermediate values | Action step of 2° programming |
| --- | --- | --- |
| 111 | 1111 | Do not program |
| 110 | 1110 | Programming to PV1 |
| 101 | 1100 | Programming to PV2 |
| 100 | 1000 | Programming to PV3 |
| 011 | 0000 | Programming to PV4 |
| 010 | 1111 | Do not program |
| 001 | 1111 | Do not program |
| 000 | 1111 | Do not program |

Being:
target value: value at which the cells are to be programmed;
3° operative/neutral intermediate values: value given to a cell during the step of second classification, said cells with neutral value being disabled during the step of second programming;
Action step of 2° programming: action to which said cells are to be subjected during said step of second programming.

18. A method, comprising:
programming a first nonvolatile memory cell to a first threshold level that is higher than a pro-established second threshold level, the first nonvolatile memory cell part of a group of capacitively coupled nonvolatile memory cells; and
after programming to first nonvolatile memory cell, programming a second nonvolatile memory cell to a third threshold level that is lower than a pro-established fourth threshold level and higher than a pro-established fifth threshold level, the second nonvolatile memory cell part of to group of nonvolatile memory cells, the pro-established fourth threshold level being higher than to pro-established second threshold level, to pro-established fifth threshold level being lower than to pro-established second threshold level.

19. The method of claim 18 wherein:
the first threshold level is higher than a pre-established sixth threshold level; and
the pre-established sixth threshold level is higher than the pre-established fourth threshold level.

20. The method of claim 18 further comprising:
while programming the first nonvolatile memory cell, programming a third nonvolatile memory cell to a sixth threshold level that is higher than the pre-established second threshold level and lower than the first threshold level, the third nonvolatile memory cell part of the group of capacitively coupled nonvolatile memory cells; and
while programming the second nonvolatile memory cell, programming the third nonvolatile memory cell to a seventh threshold that is higher than the pre-established fourth threshold level and lower than the first threshold level.

21. The method of claim 18, further comprising:
wherein the first threshold level is higher than a pre-established sixth threshold level;
wherein the pre-established sixth threshold level is higher than the pre-established fourth threshold level;
while programming the first nonvolatile memory cell, programming a third nonvolatile memory cell to a seventh threshold level that is higher than the pre-established second threshold level and lower than the pre-established sixth threshold level, the third nonvolatile memory cell part of the group of capacitively coupled nonvolatile memory cells; and
while programming the second nonvolatile memory cell, programming the third nonvolatile memory cell to an eighth threshold that is higher than the pre-established fourth threshold level and lower than the pre-established sixth threshold level.

22. The method of claim 18 wherein:
programming the first nonvolatile memory cell comprises applying to the first nonvolatile memory cell programming pulses each having approximately a first width; and
programming the second nonvolatile memory cell comprises applying to the second nonvolatile memory cell programming pulses each having approximately a second width that is shorter than the first width.

23. A method, comprising:
programming a first nonvolatile memory cell to a first threshold level by applying to the memory cell programming pulses each having a first width, the first nonvolatile memory and part of a group of capacitively coupled nonvolatile memory cells; and
after programming the first nonvolatile memory cell, programming a second nonvolatile memory cell to a second threshold level that is lower than the first threshold level by applying to the second nonvolatile memory cell programming pulses each having a second width that is shorter than the first width, the second nonvolatile memory cell part of the group of nonvolatile memory cells;
while programming the first nonvolatile memory cell, programming a third nonvolatile memory cell to third threshold level that is lower than the first threshold level by applying to the third nonvolatile memory cell programming pulses having the first width, the third nonvolatile memory cell part of the group of capacitively coupled nonvolatile memory cells; and
while programming the second nonvolatile memory cell, programming the third nonvolatile memory cell to a fourth threshold that is higher than the second threshold and lower than the first threshold by applying to the third nonvolatile memory cell programming pulses having the second width.

24. A memory circuit, comprising:
a group of capacitively coupled nonvolatile memory cells each having a respective node and each operable to store multiple bits of data; and
a programming circuit coupled to the nodes of the memory cells and operable to program a first of the nonvolatile memory cells to a first threshold level that is higher than pre-established second threshold level, and
after programming the first nonvolatile memory cell, program a second of the nonvolatile memory cells to a third threshold level that is lower than a pre-established fourth threshold level and higher than a pre-established fifth threshold level, the pre-established fourth threshold level being higher than the pre-established second threshold level, the pre-established fifth threshold level being lower than the pre-established second threshold level.

25. The memory circuit of claim 24 wherein the programming circuit is further operable to:
while programming the first nonvolatile memory cell, programming a third one of the nonvolatile memory cells to a sixth threshold level that is higher than the pre-established second threshold level and lower than the first threshold level; and
while programming the second nonvolatile memory cell, program the third nonvolatile memory cell to a seventh threshold that is higher than the pre-established fourth threshold level and lower than the first threshold level.

26. The memory circuit of claim 24 wherein the programming circuit is further operable to:
program the first nonvolatile memory cell by applying to the node of the first nonvolatile memory cell programming pulses each having approximately a first width; and
program the second nonvolatile memory cell by applying to the node of the second nonvolatile memory cell programming pulses each having approximately a second width that is shorter than the first width.

27. A memory circuit, comprising:
a group of capacitively coupled nonvolatile memory cells each having a respective node and each operable to store multiple bits of data; and
a programming circuit coupled to the nodes of the memory cells and operable to program a first of the nonvolatile memory cells to a first threshold level by applying to the node of the first memory cell programming pulses each having a first width, and
after programming the first nonvolatile memory cell, program a second of the nonvolatile memory cells to a second threshold level that is lower than the first threshold level by applying to the node of the second nonvolatile memory cell programming pulses each having a second width that is shorter than the first width;
while programming the first nonvolatile memory cell, program a third of the nonvolatile memory cells to third threshold level that is lower than the first threshold level by applying to the node of the third nonvolatile memory cell programming pulses having the first width; and
while programming the second nonvolatile memory cell, program the third nonvolatile memory cell to a fourth threshold that is higher than the second threshold and lower than the first threshold by applying to the node of the third nonvolatile memory cell programming pulses having the second width.

28. A system, comprising:
a controller; and
a memory circuit coupled to the controller and comprising
a group of capacitively coupled nonvolatile memory cells each having a respective node and each operable to store multiple bits of data; and
a programming circuit coupled to the nodes of the memory cells and operable to program a first of the nonvolatile memory cells to a first threshold level that is higher than a pre-established second threshold level, and after programming the first nonvolatile memory cell, program a second of the nonvolatile memory cells to a third threshold level that is lower than a pre-established fourth threshold level and higher than a pre-established fifth threshold level, the pre-established fourth threshold level being higher than the pre-established second threshold level, the pre-established fifth threshold level being lower than the pre-established second threshold level.

29. The system of claim 28 wherein the memory circuit comprises an electrically erasable and programmable memory circuit.

* * * * *

UNITED STATES PATENT AND TRADEMARK OFFICE
CERTIFICATE OF CORRECTION

PATENT NO. : 7,688,633 B2
APPLICATION NO. : 11/732486
DATED : March 30, 2010
INVENTOR(S) : Andrea Martinelli et al.

Page 1 of 1

It is certified that error appears in the above-identified patent and that said Letters Patent is hereby corrected as shown below:

Column 18:
Line 37, "pro-" should be -- pre- --;
Line 41, "to" should be -- the --;
Line 43, "pro-" should be -- pre- --;
Line 44, "pro-" should be -- pre- --;
Line 46, "pro-" should be -- pre- --;
Line 47, "to pro-" should be -- the pre- --;
Line 48, "to pro-" should be -- the pre- --;
Line 49, "to pro-" should be -- the pre- --.

Column 19:
Line 31, "and" should be -- cell --;
Line 60, after "than" insert -- a --.

Signed and Sealed this

Eighteenth Day of May, 2010

David J. Kappos
*Director of the United States Patent and Trademark Office*